(12) United States Patent
Zhang et al.

(10) Patent No.: US 9,972,968 B2
(45) Date of Patent: May 15, 2018

(54) PASSIVATION OF LASER FACETS AND SYSTEMS FOR PERFORMING THE SAME

(71) Applicant: Trumpf Photonics, Inc., Cranbury, NJ (US)

(72) Inventors: Qiang Zhang, Princeton, NJ (US); Haiyan An, Plainsboro Township, NJ (US); Hans Georg Treusch, Princeton Junction, NJ (US)

(73) Assignee: Trumpf Photonics, Inc., Cranbury, NJ (US)

( * ) Notice: Subject to any disclaimer, the term of this patent is extended or adjusted under 35 U.S.C. 154(b) by 0 days. days.

(21) Appl. No.: 15/133,334

(22) Filed: Apr. 20, 2016

(65) Prior Publication Data
US 2017/0310077 A1   Oct. 26, 2017

(51) Int. Cl.
*H01S 5/02* (2006.01)
*H01S 5/028* (2006.01)
*H01S 5/343* (2006.01)
*H01S 5/10* (2006.01)
*H01J 37/32* (2006.01)
(Continued)

(52) U.S. Cl.
CPC ............ *H01S 5/0282* (2013.01); *C23C 14/46* (2013.01); *C30B 23/066* (2013.01); *C30B 29/48* (2013.01); *H01J 37/32082* (2013.01); *H01J 37/32816* (2013.01); *H01J 37/32889* (2013.01); *H01S 5/0281* (2013.01); *H01S 5/0287* (2013.01); *H01S 5/10* (2013.01); *H01S 5/34313* (2013.01);
(Continued)

(58) Field of Classification Search
None
See application file for complete search history.

(56) References Cited

U.S. PATENT DOCUMENTS 5,063,173 A   11/1991   Gasser et al.
5,490,880 A   2/1996   Kao et al.
(Continued)

FOREIGN PATENT DOCUMENTS

EP   0684671 A1   11/1995

OTHER PUBLICATIONS

An et al., "Advances in high power and high brightness leaser bars with enhanced reliability", Proc. of SPIE, vol. 8605, 2013, 10 pages.
(Continued)

*Primary Examiner* — Armando Rodriguez
(74) *Attorney, Agent, or Firm* — Fish & Richardson P.C.

(57) ABSTRACT

Methods of passivating at least one facet of a multilayer waveguide structure can include: cleaning, in a first chamber of a multi-chamber ultra-high vacuum (UHV) system, a first facet of the multilayer waveguide structure; transferring the cleaned multilayer waveguide structure from the first chamber to a second chamber of the multi-chamber UHV system; forming, in the second chamber, a first single crystalline passivation layer on the first facet; transferring the multilayer waveguide structure from the second chamber to a third chamber of the multi-chamber UHV system; and forming, in the third chamber, a first dielectric coating on the first single crystalline passivation layer, in which the methods are performed in an UHV environment of the multi-chamber UHV system without removing the multilayer waveguide structure from the UHV environment.

16 Claims, 10 Drawing Sheets

(51) Int. Cl.
 *C30B 23/06* (2006.01)
 *C30B 29/48* (2006.01)
 *C23C 14/46* (2006.01)

(52) U.S. Cl.
 CPC ... *H01J 2237/327* (2013.01); *H01J 2237/335* (2013.01)

(56) References Cited

U.S. PATENT DOCUMENTS

| | | | |
|---|---|---|---|
| 5,665,637 A * | 9/1997 | Chand | H01S 5/0281 372/43.01 |
| 5,799,028 A | 8/1998 | Geels et al. | |
| 6,451,120 B1 | 9/2002 | Hubbard et al. | |
| 6,546,032 B1 | 4/2003 | Oeda et al. | |
| 6,590,920 B1 | 7/2003 | McElhinney et al. | |
| 6,618,409 B1 * | 9/2003 | Hu | H01L 33/44 372/43.01 |
| 6,744,796 B1 | 6/2004 | Chakrabarti | |
| 7,338,821 B2 | 3/2008 | Ressel et al. | |
| 8,369,371 B1 | 2/2013 | Chin et al. | |
| 2003/0043872 A1 * | 3/2003 | Yokozeki | B82Y 20/00 372/46.016 |
| 2009/0257466 A1 | 10/2009 | Eberhard et al. | |
| 2010/0120238 A1 | 5/2010 | Kitano et al. | |
| 2012/0325272 A1 | 12/2012 | Rebstock | |
| 2013/0200518 A1 * | 8/2013 | Ahmed | H01L 21/76843 257/750 |
| 2014/0065798 A1 | 3/2014 | Ahmed et al. | |
| 2016/0111307 A1 * | 4/2016 | Davis | H01J 37/32935 438/16 |

OTHER PUBLICATIONS

Hirsch et al., "The Use of Atomic Hydrogen for Substrate Cleaning for Subsequent Growth of II-IV Semiconductors", Journal of Electronic Materials, vol. 26, No. 6, 1997, 8 pages.
"The Lumics Laser diode Technology", brochure, Lumics GmbH, Berlin, Germany, 2015, 3 pages.
Strained-Layer Superlattices: Materials Science and Technology, Volume Editor: Thomas P. Pearsall, pp. 371-375, Academic Press, 1991.
Skierbiszewski et al., "InAlGaN Laser Diodes Grown by Plasma Assisted Molecular Beam Epitaxy", Lithuanian Journal of Physics, vol. 51, No. 4, 2011, 7 pages.
Turski et al., "Cyan Laser Diode Grown by Plasma-Assisted Molecular Beam Epitaxy", Applied Physics Letters, 104, 023503, 2014, 5 pages.
Yin et al., "Single-Crystal Y2O3 Epitaxially on GaAs(011) and (111) Using Atomic Layer Deposition", Materials, 2015, 8, pp. 7084-7093.
International Search Report and Written Opinion in International Application No. PCT/US2017/028072, dated Jan. 12, 2018, 15 pages.

* cited by examiner

PASSIVATION OF LASER FACETS AND SYSTEMS FOR PERFORMING THE SAME

TECHNICAL FIELD

The present disclosure relates to the passivation of laser facets, as well as systems for performing the same.

BACKGROUND

Semiconductor lasers are electro-optical devices that convert electrical energy to light, for use in various applications such as optical communication systems, laser printers, disc drives, among others. High power semiconductor lasers, in particular, are useful in laser machining applications. A dominant root cause of failure of high power semiconductor lasers is known as catastrophic optical mirror damage (COMD), which typically occurs when a semiconductor laser is operated at high power outputs for extended periods of time. The extended operation of the laser with high output power generates heat, which, in turn, causes degradation of a mirror or mirrors arranged at one or more facets of the laser. The resulting mirror damage shortens the laser lifetime and increases costs due to the need to obtain replacement lasers.

SUMMARY

The present disclosure is directed to the fabrication of a high quality laser facet passivation layers for semiconductor lasers, as well as systems for performing the same. The preparation of a semiconductor laser facet and the formation of the passivation layer on the laser facet is performed entirely under an ultra-high vacuum (UHV) environment using an integrated multi-chamber UHV system. By performing the facet cleaning and passivation fabrication process entirely under a UHV environment, an extremely high quality and clean passivation layer interface is achieved, such that the resulting semiconductor laser exhibits superior performance and reliability, with the occurrence of COMD being suppressed or eliminated as the root cause of device failure. Additionally, in situ monitoring of the passivation layer growth allows, in certain implementations, precise control of the passivation layer stoichiometry and thickness, leading to additional improvement in device performance.

The high quality passivation layer is obtained using the novel integrated multi-chamber UHV systems described herein that have different chambers specifically devoted to different aspects of the passivation layer formation process, such as thermal cleaning, chemical cleaning, and molecular beam epitaxy. During the fabrication process, the laser device passes among the different chambers while being kept under UHV so as to reduce contamination. Moreover, the system can further include a device-flipping chamber in which the orientation of the device is altered so that multiple different facets of the laser device may be subject to the passivation layer fabrication process.

In general, in some aspects, the subject matter of the present disclosure can be embodied in methods of passivating at least one facet of a multilayer waveguide structure, in which the methods include: cleaning, in a first chamber of a multi-chamber ultra-high vacuum (UHV) system, a first facet of the multilayer waveguide structure; transferring the cleaned multilayer waveguide structure from the first chamber to a second chamber of the multi-chamber UHV system; forming, in the second chamber, a first single crystalline passivation layer on the first facet; transferring the multilayer waveguide structure from the second chamber to a third chamber of the multi-chamber UHV system; and forming, in the third chamber, a first dielectric coating on the first single crystalline passivation layer, in which the methods are performed in an UHV environment of the multi-chamber UHV system without removing the multilayer waveguide structure from the UHV environment.

Implementations of the methods can include one or more of the following features. For example, in some implementations, the methods include monitoring a quality of the first single crystalline passivation layer during formation of the first single crystalline passivation layer. Monitoring the quality of the first single crystalline passivation layer can include obtaining a reflection high energy electron diffraction (RHEED) pattern from the first single crystalline passivation layer.

In some implementations, the multilayer waveguide structure is arranged within the first chamber according to a first orientation during the cleaning of the first facet, in which passivating the at least one facet includes: arranging the multilayer structure within the first chamber according to a second orientation different from the first orientation; and cleaning, in the first chamber, a second facet of the multilayer waveguide structure while the multilayer structure is arranged according to the second orientation. Arranging the multilayer structure within the first chamber according to the second orientation can include: transferring the multilayer waveguide structure, after cleaning the first facet, from the first chamber to a fourth chamber of the multi-chamber UHV system turning the multilayer waveguide structure in the fourth chamber; and transferring the turned multilayer waveguide structure from the fourth chamber to the first chamber.

In some implementations, the multilayer waveguide structure is arranged within the second chamber according to a first orientation during the forming of the first passivation layer on the first facet, in which passivating the at least one facet includes: arranging the multilayer waveguide structure within the second chamber according to a second orientation different from the first orientation; and forming, in the second chamber, a second single crystalline passivation layer on the second facet while the multilayer structure is arranged according to the second orientation. Arranging the multilayer structure within the second chamber according to the second orientation can include: transferring the multilayer waveguide structure, after forming the first passivation layer, from the second chamber to a fourth chamber of the multi-chamber UHV system; turning the multilayer waveguide structure in the fourth chamber; and transferring the turned multilayer waveguide structure from the fourth chamber to the second chamber.

In some implementations, cleaning the first facet includes chemically removing an oxide from the first facet of the multilayer waveguide structure by exposing the first facet to atomic hydrogen.

In some implementations, passivating the at least one facet includes exposing the multilayer waveguide structure to infrared radiation so as to heat the multilayer waveguide structure at a temperature between about 150° C. and about 200° C.

In some implementations, the first passivation layer is lattice-matched to the first facet of the multilayer waveguide structure.

In some implementations, the first passivation layer is applied until the layer has a thickness between about 10 nm to about 60 nm.

In some implementations, the first passivation layer includes a Group II-VI semiconductor compound material.

In some implementations, the methods further include passivating at least one facet of each of a plurality of multilayer waveguide structures in the UHV environment of the multi-chamber UHV system without removing the plurality of multilayer waveguide structures from the UHV environment, in which the plurality of multilayer waveguide structures are stacked onto a fixture.

In general, in some other aspects, the subject matter of the present disclosure can be embodied in one or more multi-chamber ultra-high vacuum (UHV) systems, in which the one or more systems include: a central chamber comprising a transfer arm; multiple secondary chambers, each of which is coupled to the central chamber by a corresponding gate valve, in which the multiple secondary chambers include an outgassing chamber, an atomic hydrogen cleaning chamber, a molecular beam epitaxy chamber, an ion-beam sputter deposition chamber, and a device flipping chamber, and in which the transfer arm is configured to extend from the central chamber into each secondary chamber of the plurality of secondary chambers; a pump system operable to establish a UHV environment in each of the central chamber and the plurality of secondary chambers; and a control system operatively coupled to the transfer arm, the gate valves and to the pump system, and configured to automatically control movement of the transfer arm and opening and closing of the gate valves.

Implementations of the one or more systems can include one or more of the following features. For example, in some implementations, the outgassing chamber includes an infrared light source.

In some implementations, the one or more systems include a radio-frequency (RF)-generator and an atomic hydrogen source coupled to the atomic hydrogen cleaning chamber and to the control system, in which the control system is further configured to activate a plasma within the atomic hydrogen cleaning chamber by automatically controlling a power generated by the RF-generator and by automatically controlling a flow of atomic hydrogen into the cleaning chamber from the atomic hydrogen source.

In some implementations, the molecular beam epitaxy chamber includes: an electron source gun operable to produce a beam of electrons, in which the electron source gun is arranged to direct the beam of electrons toward a sample location within the molecular beam epitaxy chamber; and a detector arranged to detect electrons produced by the electron source gun and diffracted from the sample location to create a reflection high-energy electron diffraction (RHEED) pattern.

In general, in some other aspects, the subject matter of the present disclosure can be embodied in one or more devices that include: a multilayer waveguide structure having at least first and second opposed facets; a first single crystalline passivation layer bound to the first facet of the multilayer waveguide structure; a second single crystalline passivation layer bound to the second facet of the multilayer waveguide structure, in which each of the first passivation layer and the second passivation layer includes a II-VI semiconductor compound material that is lattice-matched to the multilayer waveguide structure; a first reflective coating on the first passivation layer; and a second reflective coating on the second passivation layer.

Implementations of the one or more devices can include one or more of the following features. For example, in some implementations, the multilayer waveguide structure includes: a GaAs substrate doped N-type; a first $Al_xGa_{1-x}As$ cladding layer on the GaAs substrate; a first $Al_yGa_{1-y}As$ cladding layer on the first $Al_xGa_{1-x}As$ cladding layer; a InGaAs active layer on the first $Al_yGa_{1-y}As$ cladding layer; a second $Al_yGa_{1-y}As$ cladding layer on the InGaAs active layer; and a second $Al_xGa_{1-x}As$ cladding layer on the second $Al_yGa_{1-y}As$ cladding layer, in which the second $Al_xGa_{1-x}As$ cladding layer is doped P-type, wherein x is between 0.15 to 0.6, and y is between 0.24 to 0.35.

In some implementations, each of the first passivation layer and the second passivation layer includes ZnSe. Each of the first passivation layer and the second passivation layer can include a thickness between about 10 nm and about 60 nm.

One or more of the foregoing implementations of the methods, systems and devices can include one or more of the following advantages. For example, because each of the different chambers of the integrated multi-chamber system is maintained under UHV, a laser device sample transferred between the chambers is not exposed to air, thus reducing or eliminating contamination and the formation of oxides on the laser device, which otherwise degrade the laser device reliability and lifetime. In particular, by including a moveable and extendable transfer arm within the system, as well as a device flipping chamber, the laser devices do not need to be removed to atmosphere to modify the orientation of the device so as to clean and passivate different surfaces of the devices. The cleaning and passivating of laser diode facets as described herein provides laser diodes that suffer less optical loss at the facets and that have a reduced or no occurrence of COMD. In some implementations, using atomic hydrogen cleaning to remove oxide from a laser device provides a nondestructive oxide removal process, leaving the cleaned surface undamaged. A non-damaged clean surface is useful for obtaining high quality single crystalline growth of the passivation layer.

An advantage of using a single crystalline passivation layer is that it helps, in some implementations, to prevent contaminants from depositing on the cleaned facet surface of the laser device, and prevents the re-formation of the amorphous oxide on the crystalline waveguide structure. In addition, a crystalline passivation film can withstand high temperatures to a greater extent than amorphous passivation films, leading to improved laser device lifetime, as the laser is repeatedly heated during use. Furthermore, semiconductor lasers processed according to the disclosure provide, in certain implementations, substantially improved performance, reliability and lifetimes.

As used herein, the term "ultra-high vacuum" (UHV) is understood to mean a vacuum regime characterized by pressures equal to or lower than about $10^{-8}$ torr. Though the presence of process gas and/or plasma in a UHV environment can cause the pressure to rise, such an environment can still be characterized as UHV if the rise in pressure is maintained equal to or lower than about $10^{-5}$ torr and is due to the introduction of the process gas and/or plasma, but not from the introduction of undesired gas particles and/or contamination.

As used herein, the term "flipping" is understood to alter an orientation by turning over.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The details of one or more embodiments are set forth in the accompanying drawings and the description below. Other features and advantages will be apparent from the description, the drawings, and the claims.

DETAILED DESCRIPTION

Figure 1:
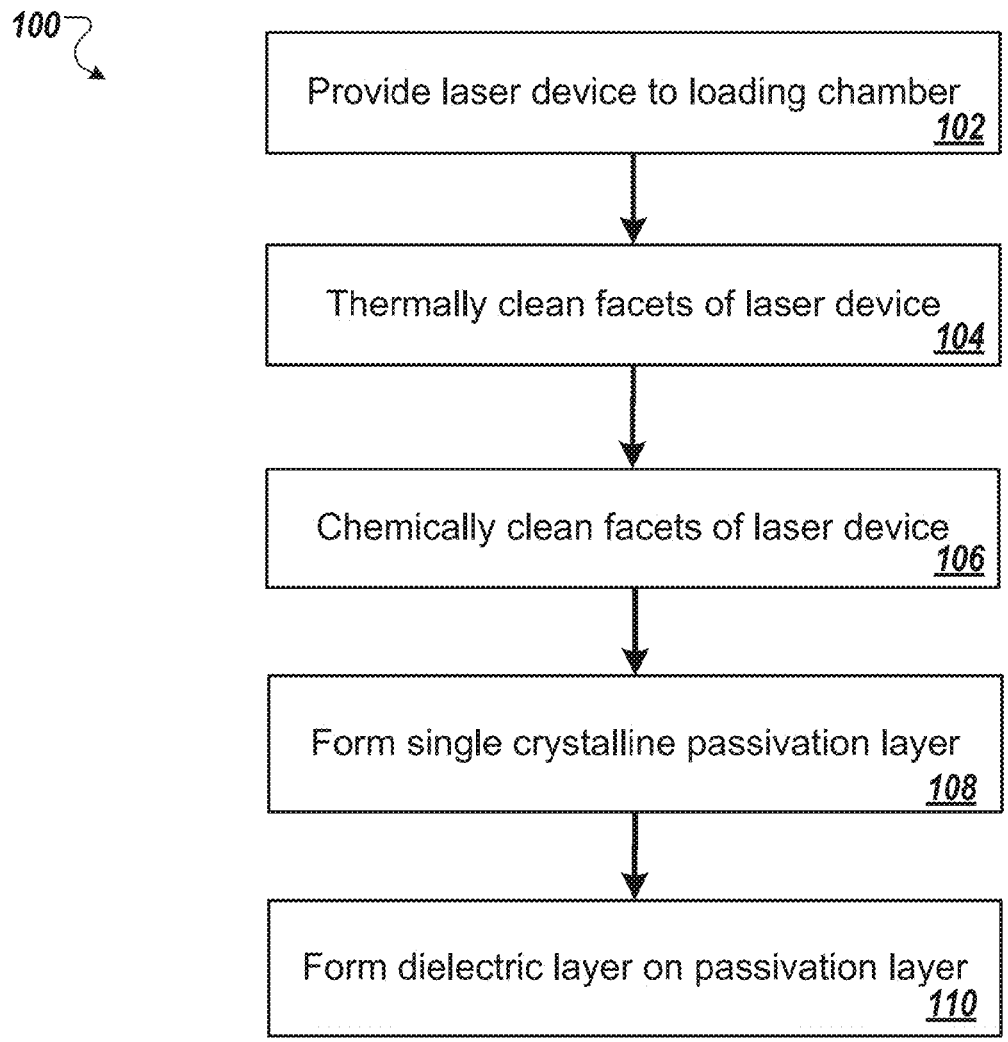
FIG. 1 is a flow chart that illustrates an example of a process for fabricating a high quality semiconductor laser facet passivation layer.
Figure 2:
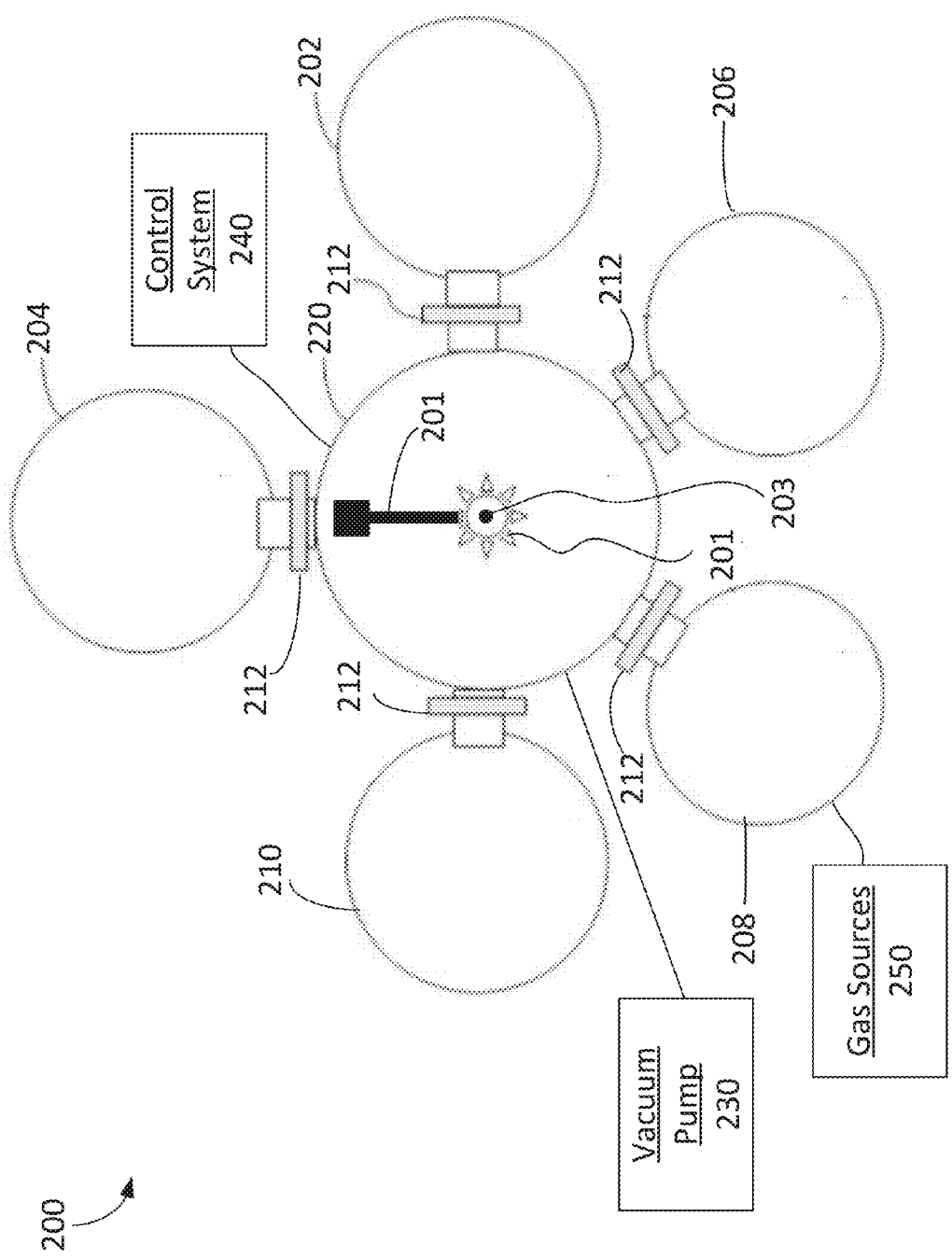
FIG. 2 is a schematic diagram that illustrates an integrated multi-chamber ultra-high vacuum (UHV) system in which the process of FIG. 1 can be performed.

FIG. 1 illustrates an example of a process 100 for fabricating a high quality semiconductor laser facet passivation layer. FIG. 2 illustrates an integrated multi-chamber ultra-high vacuum (UHV) system 200 in which process 100 can be performed. FIGS. 3-6 illustrate the different states of a laser device 10 that has been enhanced with the passivation process 100.

As shown in FIG. 2, the integrated multi-chamber UHV system 200 includes a central chamber 220 and multiple secondary chambers (202, 204, 206, 208, 210), each of which is coupled to the central chamber by a corresponding gate valve 212. A gate valve includes a passage through which items can move but that can be sealed to maintain vacuum. The gate valves 212 are constructed for use in UHV environments and serve to isolate the secondary chambers from the central chamber 220. The multiple secondary chambers include, for example, an outgassing chamber 202, a device flipping chamber 204, an atomic hydrogen cleaning chamber 206, a molecular beam epitaxy chamber 208, and a dielectric coating chamber 210 (also referred to as an ion-beam sputter deposition (IBSD) chamber 210).

The system 200 further includes a transfer arm 201 connected to a central chamber 203. The transfer arm 201 is an extendable metal structure contained within the central chamber 220. At one end, the transfer arm 201 includes a pick-up plate for picking up and securing device samples. The transfer arm 201 is configured such that it can be extended into a secondary chamber to either take hold of a sample device from within the secondary chamber or release a sample device in the secondary chamber. For example, the transfer arm 201 can have a telescoping rod structure formed of concentric tubular parts that, when sliding into one another shorten the length of the rod, and when sliding out from one another, increase the length of the rod. In addition, the transfer arm is configured so that it can be rotated to any one of the different secondary chambers. For example, an end of the transfer arm that is opposite to the pick-up plate can be coupled to a motor 201 (e.g., a piezoelectric motor) or gear that, upon turning, causes the transfer arm 201 to move around a central axis 203 of the central chamber 220 toward the gate valve of any one of the secondary chambers.

The system 200 further includes a vacuum pump system 230 coupled to the central chamber 220 and each of the secondary chambers (202, 204, 206, 208 and 210) through UHV rated tubing. The vacuum pump system 230 is operable to establish a UHV environment in each of the central chamber 220 and multiple secondary chambers (202, 204, 206, 208 and 210). Because each of the different chambers is maintained under UHV, a sample transferred between the chambers is not exposed to air, thus reducing or eliminating contamination and the formation of oxides on the laser device, which degrade the laser device reliability and lifetime.

The system 200 further includes an electronic control system 240 operatively coupled to the transfer arm 201 (e.g., coupled to the motor that drives the transfer arm 201), the gate valves 212 and the pump system 230, among other components. The control system 240 is configured to control movement of the transfer arm and opening and closing of the gate valves. The control system 240 can be further configured to control the operation of the pump system 230, such as sending electronic signals that turn the pump system 230 on or off, or that control the vacuum level that is obtained in each chamber. In some implementations, one or more of the chambers can include components such as heaters, electron source guns, and detectors that can also be controlled by the electronic control system 240. For instance, the control system 240 can send electronic signals to a heater element to establish a specified temperature or to an electron source gun to set an electronic beam intensity and/or direction. The control system 240 can receive electronic signals from a detector contained within a chamber and process the signal to convert the information into a desired format suitable for understanding by a user. In some implementations, the system 200 further includes one or more gas sources 250 coupled to at least one of the secondary chambers. The control system 240 can be operable to control supply valves to set the level of gas from the gas sources that is provided to the at least one secondary chamber. The control system 240 includes at least one electronic processor and corresponding memory storing executable code that, when executed by the at least one electronic processor, performs some or all of the process 100. For example, the control system 240 can be configured to automatically perform some or all of process 100. Alternatively, in some implementations, the control system 240 is configured to receive instructions entered manually by a user to perform some or all of the process 100.

Figure 3:
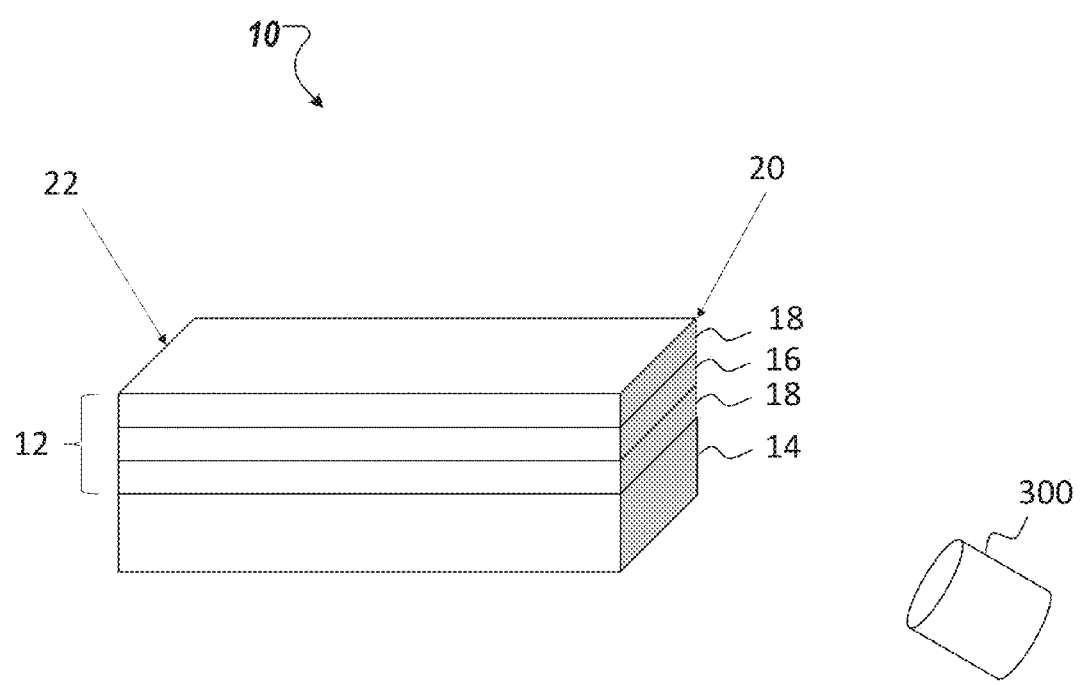
FIGS. 3-6 are schematic diagrams that illustrate the different states of a laser device subject to the passivation process of FIG. 1.

Referring to FIG. 1, process 100 includes first providing (102) a semiconductor laser device 10, such as a laser diode, to a loading/outgassing chamber 202 of the integrated multi-chamber UHV system 200. Laser device 10 is provided to chamber 202 in a partially-completed state. For instance, as shown in FIG. 3, the laser device 10 that is loaded into the chamber 202 includes a multilayer waveguide structure 12 formed on a substrate 14. The multilayer structure 12 includes an optically active layer 16 surrounded by cladding layers 18. The cladding layers 18 can have a refractive index lower than the refractive index of the optically active layer 16, such that they form a waveguide that confines light within the optically active layer 16. The structure 12 also can include electrical contact layers (not shown). The optically active layer 16 and cladding layers 18 can be formed from semiconductor materials, such as Group II-VI or Group III-V semiconductor compounds including, for example, GaAs, AlGaAs, InGaAs, InP, GaN, ZnSe, among others. For instance, in an example of a device, the laser diode 10 can be a quantum well semiconductor laser designed to emit laser light at about 980 nm, in which the optically active layer 16 is formed from GaAs or InGaAs, whereas the cladding layers 18 are formed from $Al_xGa_{1-x}As$ and/or $Al_yGaAs$, with y ranging between 0.15-0.6 and x ranging between 0.15 to 0.35. Other compounds including chalcogenides, such as ZnSe, ZnTe, CdSe, also can be used as the laser diode material. The optically active layer 16 and cladding layers 18 can be formed on the substrate 14 using standard semiconductor deposition processes, such as molecular beam epitaxy (MBE) or metal organic chemical vapor deposition (MOCVD). The structure 12 shown in FIG. 3 is intended to be a representative example of a laser device and does not limit the type of laser devices that can be formed using the processes disclosed herein. For instance, the laser device can have more than two cladding layers, each having a different composition and/or thickness.

Prior to loading the semiconductor laser device 10, a first end surface and/or second opposing end surface of the device 10 are cleaved to expose a first facet 20 and/or second facet 22, respectively. In general, the optically active layer 16 and cladding layer 18 have a single crystalline structure, such that the cleaved facets expose a crystalline plane (e.g., cleaving can expose the 110 crystalline plane for a GaAs laser diode). The exposed facet or facets are to be cleaned and passivated by the process 100 to reduce contamination that can lead to COMD. With the cleaned and passivated surfaces, light that is amplified by stimulated emission within the device 10 suffers less loss upon reflection at reflective surfaces arranged at or on the passivated ends of the device 10.

In some implementations, multiple semiconductor laser devices 10, such as multiple laser diodes, are stacked on one another and provided to the loading chamber of the integrated multi-chamber UHV system. For example, such a stack can include 15, 20, 25, 30, 35, 40, 45, 50, 55, 60, 65 or 70 semiconductor laser devices stacked on one another and provided to the loading chamber. The laser devices can be separated from one another in the stack by a spacer wafer such as, for example, a GaAs spacer wafer. In some implementations, multiple laser devices are stacked and held together within a fixture. The fixture can be, for example, a metal frame sized to fit and hold multiple laser devices, and having an opening through which a facet on one side of each laser devices is exposed. The fixture, in turn, can be mounted, with other fixtures having stacked laser devices, onto a carrier device and placed on a sample holder within the chamber 202. Stacking multiple laser devices in this manner, renders the fabrication process more efficient as more laser devices can be processed at a single time for mass production. The laser device 10, fixture or carrier device can be secured to the sample holder using, for example, a screw coupled base and cap. That is, the sample holder can include a base plate and a cap plate, which sandwich multiple fixtures and are screwed to one another. The base plate and/or the cap can include an opening through which the facets of the laser device 10 (laser devices) can be exposed. The sample holder then can be loaded in a cassette inside the loading chamber for further process.

Once the semiconductor laser device 10 is loaded into the outgassing chamber 202 of the integrated multi-chamber UHV system 200, the outgassing chamber 202 is pumped down to an ultra-high vacuum. That is, the pressure within the outgassing chamber 202 is reduced to about $10^{-8}$ Torr or less to reduce the contamination and oxidation of the laser device during and between processing steps. The remaining chambers within the UHV system 200 are also maintained under the ultra-high vacuum, such that the pressure within the loading chamber matches the pressure in the other chambers of the system 200. After reducing the pressure within the outgassing chamber, the exposed facet (or facets) of the laser device 10 undergo a first cleaning process. In particular, the exposed facet (or facets) are thermally cleaned (104).

FIG. 3 is a schematic that illustrates an example of a laser device 10 contained within the outgassing chamber 202, in which the chamber 202 includes an infrared (IR) light source 300. Thermal cleaning of the facet can include, for example, exposing a cleaved facet of the laser device 10 to IR light from the IR light source 300. The IR light source 300 can include, for example, a light emitting diode (LED), a laser diode, or a Xe lamp, among other sources. The IR light heats the semiconductor laser device 10 to remove moisture and contaminants (e.g., adsorbed particles, $N_2$, $CO_2$, or $O_2$, among other contaminants) that have physically adsorbed to the facet surface subsequent to cleaving. The temperature measured in the chamber during heating is between about 150° C. and about 200° C. The laser device 10 can be subject to IR heating for various different lengths of time. For example, in some implementations, the laser device 10 can be subject to IR heating for 10 minutes, 15 minutes, 20 minutes, 30 minutes, or even 40 minutes. Other heating times are also possible. The chamber pressure can be a good indicator of how long the heating process should take. This is because upon heating, the outgassing of contaminants will initially cause the pressure within the chamber to rise, after which the pressure will steadily fall. Once the pressure has fallen below a desired threshold (e.g., $5 \times 10^{-7}$ Torr), the thermal cleaning process may be considered finished.

As explained herein, in some implementations, at least two facets of the laser device 10 (e.g., two opposing end surfaces of the device 10) are cleaved prior to loading the device 10 within chamber 202. Upon loading, the laser device 10 is arranged and oriented on the sample holder within the chamber 202 such that only one cleaved facet of the laser device 10 is exposed to IR light from the IR source 203. In the case that multiple laser devices 10 are loaded, the sample holder is oriented such that each laser device has a single cleaved facet facing the IR light from the IR source 203.

In general, it may be preferable, in some implementations, to clean not just a single facet of the device 10, but the opposing facet as well to reduce contamination that leads to COMB, and the resulting degradation at the facet interfaces. Since the laser device 10 is oriented and arranged such that one cleaved facet is exposed to the IR light, the orientation of the laser device should be modified so that other facet also can be cleaned. In particular, the process 100 includes optionally re-arranging the laser device 10 from a first orientation to a second different orientation within the outgassing chamber 202 such that the second cleaved facet of the laser device 10 can be exposed to the IR light.

To re-arrange the orientation of the laser device 10 within the chamber 202, the system 200 includes a transfer arm 201 and a flip chamber 204. In particular, the process of re-arranging the laser device 10 can include first extending the transfer arm 201 from the central chamber of the system 200 into the outgassing chamber 202 and securing the laser device 10 to the transfer arm 201. If one or more laser devices 10 are mounted within a sample holder, the transfer arm 201 can secure the sample holder. For example, the end of the transfer arm that extends into the chamber can include a pick-up plate, also referred to as an end effecter. The end effecter can include multiple pins (e.g., 4 pins) that protrude from the effector and are spaced apart from each other to form an area in which a fixture and/or carrier can be positioned. When the sample holder is positioned in the area formed by the pins, the pins serve to retain the sample holder in place. For example, the transfer arm 201 can extend from the center cluster chamber to the loading chamber 202 and move under the selected sample holder. Once positioned under the sample holder, the transfer arm 201 then moves upwards to position the sample holder within the area formed by the pins while the sample holder is supported from beneath by the end effecter. Once secured, the laser device 10 is moved, using the transfer arm 201, from the outgassing chamber 202 to the flip chamber 204. For example, the transfer arm holding the laser device 10 can retract into the central chamber, where the arm 201 then rotates so that the arm 201 is aligned with a gate valve sealing the flip chamber 204. The gate valve of the flip chamber can then be opened to allow the transfer arm 201 to extend into the flip chamber 204. Subsequently, the transfer arm 201 can release the sample holder containing the laser device onto a support substrate contained within the flip chamber 204. The sample holder containing the laser device 10 is secured to the support substrate by, for example, a by a two-pronged fork-shaped clamp. A motorized positioning device coupled to the support substrate then modifies the orientation of the sample holder, such that the orientation of the laser device 10 also is modified. For instance, the motorized positioning device can flip the support substrate, and the sample holder with it, upside down by rotating the support substrate about a central axis. The motorized positioning device can include, for example, a piezoelectric motor that is operated using an electronic control signal.

After modifying the orientation of the laser device (or laser devices) within the flip chamber 204, the transfer arm 201 extends into the flip chamber 204 to pick up the sample holder containing the laser device 10 having the modified orientation. Using the transfer arm 201, the flipped laser device 10 then is transferred back to the outgassing chamber 202 where the transfer arm 201 places the sample holder containing the laser device 10 (or multiple laser devices) once again within the chamber 202 but with the modified orientation (e.g., flipped upside down). The transfer arm 201 then retracts to the central chamber. Since all the chambers of the system 200 are maintained under a UHV environment, the entire process of transferring the laser device from the outgassing chamber 202 to the flip chamber 204 and back to the outgassing chamber 202 is performed under UHV, which facilitates reducing the contamination of the cleaved facet surfaces.

With the laser device 10 arranged and positioned according to the second orientation, the second cleaved facet may now be thermally cleaned by exposing the second facet to IR heat from the IR source within the outgassing chamber 202 and heating the device a temperature between about 150° C. to about 200° C. Again, the time period for subjecting the laser device to the IR heat may vary and can include, for example, 10 minutes, 15 minutes, 20 minutes, 30 minutes, or 40 minutes, among other durations.

Subsequent to performing thermal cleaning (104), the laser device 10 is subjected to a chemical cleaning (106) within the UHV system. The purpose of the chemical cleaning is to remove oxides formed on the laser device facet surfaces after cleaving. For instance, in some implementations, when the multilayer waveguide structure is cleaved under ambient conditions (e.g., room temperature and no vacuum), the exposed single crystalline material of the waveguide structure oxidizes to form an amorphous oxide layer that traps contaminants. This amorphous oxide layer can contribute to COMD.

To perform the chemical cleaning (106), the laser device 10 (or multiple laser devices) is transferred, by the transfer arm 201, from the outgassing chamber 202 to the atomic hydrogen cleaning chamber 206. The transfer arm 201 places the sample holder containing the laser device 10 on a support substrate within chamber 206, where the sample holder containing the device 10 (or multiple devices) is secured. The pressure within the chamber 206 and within the central chamber during transfer of the laser device 10 is maintained under UHV.

The chamber 206 includes an atomic hydrogen source that produces atomic hydrogen by thermally cracking hydrogen molecules (e.g., thermally dissociating hydrogen in an electron bombardment heated fine tungsten capillary) or by atomic dissociation using a hydrogen plasma within the chamber 206. An advantage of using atomic hydrogen cleaning, as opposed to, for example, ion etching to remove the oxide, is that atomic hydrogen cleaning is a nondestructive process, leaving the cleaned surface undamaged, which would otherwise result in further COMD and the resulting reduced device lifetime. A non-damaged clean surface is useful for obtaining high quality single crystalline growth of the passivation layer.

Figure 4:
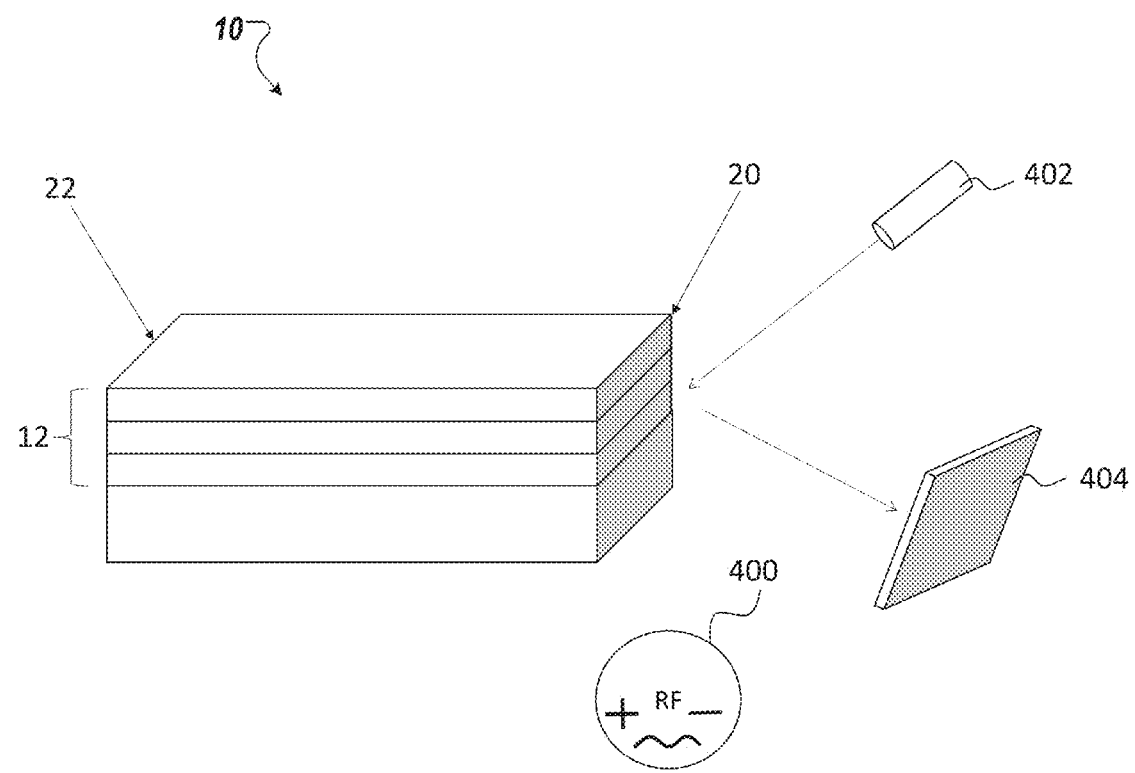

FIG. 4 illustrates an example of a laser device 10 contained within an atomic hydrogen cleaning chamber 206, in which a facet of the laser device 10 is cleaned using a hydrogen plasma. To clean using a hydrogen plasma, the temperature within the chamber is heated to between about 300° C. and 400° C. and stabilized at that temperature for about 10 minutes. Preferably, the cleaning temperature is no more than about 400° C. to avoid diffusion of contact metal into the semiconductor layers of the multilayer waveguide structure. While the chamber is still heated, an argon-hydrogen gas mixture then is introduced into the chamber 206. A radio-frequency (RF) generator 400 within the chamber 206 ignites a plasma from the Ar—H gas mixture for about 10-20 minutes. The gas provided to the chamber then is switched over to pure hydrogen to provide a hydrogen-only plasma that cleans the facet surface. The cleaning time is in a range of about 20 to about 60 minutes to achieve an oxide reduction of around two orders of magnitude. In some implementations, the presence of the process gas and plasma can cause the pressure within the chamber 206 to rise. For instance, after igniting the plasma, the pressure within the chamber 206 can increase to as much as $10^{-5}$ Torr. Despite the rise in pressure, the environment may still be understood as being ultra-high vacuum, since the presence of undesired gas or contaminants can be maintained at low concentrations within the chamber 206.

The laser device 10 is arranged and oriented within the chamber 206 such that the atomic hydrogen reacts with only one exposed cleaved facet of the laser device 10. In the case that multiple laser devices 10 are loaded, the sample holder containing the laser devices 10 is oriented and arranged on the sample holder such that each laser device has a single cleaved facet that is chemically cleaned by the atomic hydrogen.

In some implementations, the chamber 206 includes an electron source 402 and an electron detector (e.g., photoluminescence detector) 404, in which the source 402 is arranged to direct electrons from the electron source toward the sample surface and the detector 404 detects electrons that have been diffracted by the sample. The reflection high energy electron diffraction (RHEED) patterns produced at the detector can be monitored, e.g., using a charge-coupled device (CCD) camera and inspected to evaluate the how well the chemical cleaning of the facet surface has progressed. In some implementations, the RHEED patterns can be monitored simultaneously with the chemical cleaning. When a desired pattern appears, indicating that sufficient cleaning/removal of oxide material has occurred, a user of the system 600 may manually end the atomic hydrogen cleaning process within the chamber 606. Alternatively, in some cases, the pattern appearing on the screen can be evaluated by an electronic control system using image processing, such that when the desired pattern is observed, the control system automatically ends the atomic hydrogen cleaning process. In some implementations, the atomic hydrogen cleaning can be temporarily suspended while the RHEED patterns are evaluated.

As with thermal cleaning, it is preferable, in some implementations, to remove the amorphous oxide from both opposing facets (e.g., facets 20 and 22) to reduce contamination that leads to COMD. To chemically clean the opposing facet, the orientation of the laser device 10 within the chamber 206 is modified so that the opposing facet can be exposed to the atomic hydrogen. In particular, the process 100 includes optionally re-arranging the laser device 10 from a first orientation to a second different orientation within the chamber 206 such that the second cleaved facet 22 of the laser device 10 is exposed to atomic hydrogen.

To re-arrange the orientation of the laser device 10, the transfer arm 201 extends from the central chamber of the system 200 into the atomic hydrogen cleaning chamber 206 to obtain the laser device (or multiple laser devices). The laser device 10 then is moved, using the transfer arm 201, from the cleaning chamber 206 to the flip chamber 204. For example, the transfer arm 201 holding the laser device 10 can retract into the central chamber, where the arm 201 then rotates so that the arm 201 is aligned with a gate valve sealing the flip chamber 204. The gate valve of the flip chamber can then be opened to allow the transfer arm 201 to extend into the flip chamber 204. Subsequently, the transfer arm 201 can place the laser device 10 onto a support substrate contained within the flip chamber 204, where the device 10 is secured. As explained above, the orientation of the sample holder then is modified (e.g., flipped upside down) using the positioning device coupled to the holder.

After modifying the orientation of the laser device (or multiple laser devices) within the flip chamber 204, the transfer arm 201 extends into the flip chamber 204 to pick up the sample holder containing laser device 10 and having the modified orientation. Using the transfer arm 201, the flipped laser device 10 then is transferred back to the cleaning chamber 206 where the transfer arm 201 places the sample holder containing the laser device 10 (or multiple laser devices) once again on the support substrate within the chamber 206 but with the modified orientation (e.g., flipped upside down). The transfer arm 201 then retracts to the central chamber. The entire process of transferring the laser device from the atomic hydrogen cleaning chamber 206 to the flip chamber 204 and back to the atomic hydrogen cleaning chamber 206 is performed under UHV.

Subsequent to performing chemical cleaning (106), a single crystalline passivation layer is formed (108) on the cleaned facet or facets of the laser device 10. An advantage of the single crystalline passivation layer is that it helps prevent contaminants from depositing on the cleaned facet surface of the laser device 10, and prevents the re-formation of the amorphous oxide on the crystalline waveguide structure. In addition, a crystalline passivation film can withstand high temperatures to a greater extent than amorphous passivation films, leading to improved laser device lifetime, as the laser is repeatedly heated during use. To form the passivation layer, the laser device 10 (or multiple laser devices) is transferred, by the transfer arm 201, from the atomic hydrogen cleaning chamber 206 to a MBE chamber 208. The transfer arm 201 places the sample holder containing the laser device 10 on a support substrate within the chamber 208, where the sample holder is secured. The pressure within the MBE chamber 208 and within the central chamber during transfer of the laser device 10 is maintained under UHV.

In solid-source MBE, elements that form the epitaxial film can be provided in ultra-pure form (e.g., 99.999% pure) and heated in Knudsen effusion cells until they sublimate. The gaseous material then condenses on the sample surface. When condensing on a single crystalline structure, the material can itself form a single crystal layer. Preferably, the single crystalline passivation layer is formed on the multilayer waveguide structure to have the same or nearly the same lattice constant as the underlying multilayer waveguide structure in order to limit the stress that is present in the passivation layer due to lattice mismatch. If the stress is too high, this can lead to the formation of defects in the passivation layer that, in turn, can cause COMD.

Figure 5:
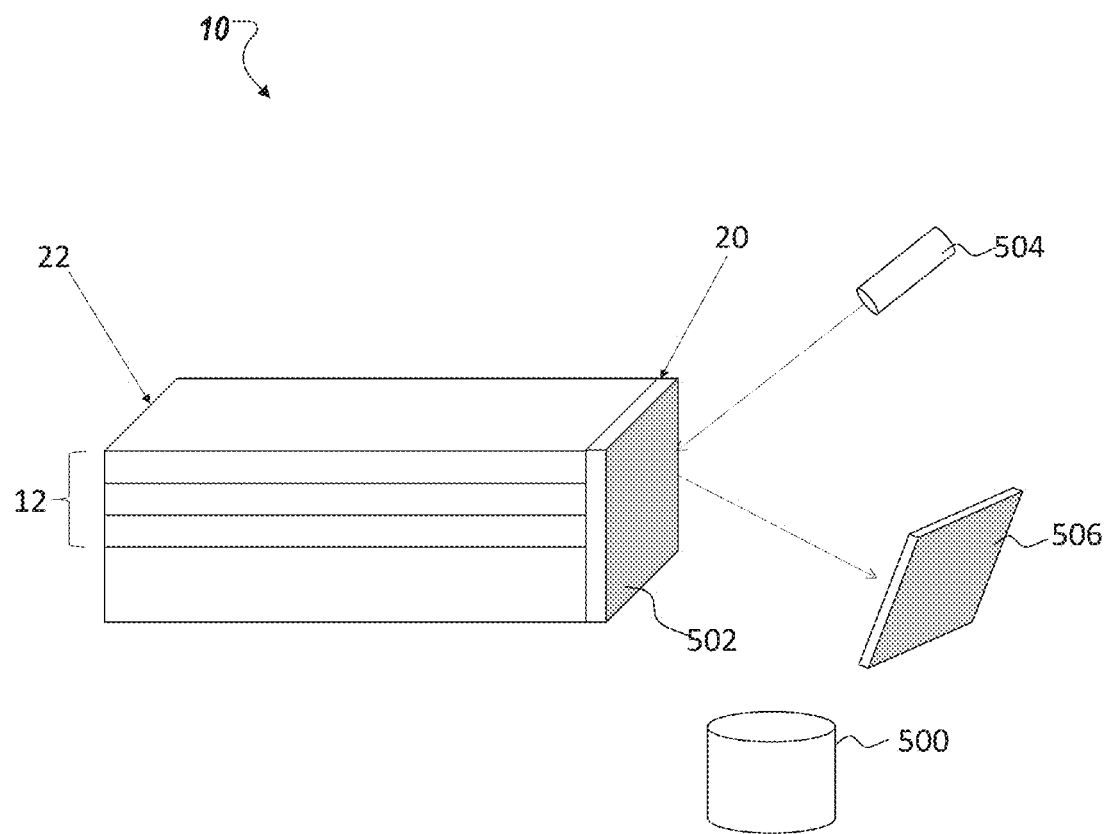

As an example, a multilayer waveguide formed from $Al_xGa_{1-x}As$ crystallizes according to a zinc-blende structure. Using MBE, a ZnSe passivation epitaxial layer can be formed on the waveguide structure according to the same zinc-blende crystal structure having the same or near identical lattice constant. FIG. 5 illustrates an example of a laser device 10 contained within the MBE chamber 208, in which the chamber 208 includes a cell 500 containing an ultra-high pure solid source for forming the passivation layer 502 on a facet 20 of the laser device 10.

By growing the single crystalline passivation layer using MBE and the UHV environment, it is possible to achieve atomically flat and clean passivation layers. Furthermore, because MBE is a thermal-equilibrium based process, MBE is generally non-destructive with respect to the formation of the passivation layer for certain passivation layer thicknesses, and thus sustains the highly crystalline arrangement of the underlying multilayer waveguide structure. For instance, to provide enough facet electron confinement and to reduce defect absorption due to heteroepitaxial growth, the passivation layer should have a thickness in a range of between about 10 nm to about 60 nm. Layers that are thicker can decrease the crystalline quality due to the intrinsic defect of hetero-epitaxial growth on multi-layer structures.

The chamber 208 can include single element sources for forming the passivation layer. For example, in some implementations, to form a ZnSe passivation layer, the chamber 208 can include separate ultra-pure Zn and Se element sources. Alternatively, the chamber 208 can include compound element sources. For example, in some implementations, to form the ZnSe passivation layer, the chamber 208 can include a single ZnSe compound source. It is preferable in some implementations to form the passivation layer with a material having a higher band gap relative to the waveguide structure to inhibit the absorption of light absorption from the waveguide and enhance the laser device reliability. Examples of other passivation layer materials, which have relatively wide band gaps and which are lattice matched or nearly lattice matched to GaAs, include, but are not limited to BeTe, ZnS, CdSe and BeCdSe. As explained herein, the optically active material of the waveguide structure is not limited to GaAs and can include other materials, such as, for example, InP or GaN. An example of a passivation layer having a relatively wide band gap and lattice matched structure for InP includes, for example, ZnSe. An example of a passivation layer having a releteively wide band gap and lattice matched structure for GaN includes, for example, BeSe.

In some implementations, the presence of the sublimated source material can cause the pressure within the chamber 208 to rise. For instance, the pressure within the chamber 208 can increase to as much as $10^{-5}$ Torr. Despite the rise in pressure, the environment can still be understood as being ultra-high vacuum, since the presence of undesired gas or contaminants can be maintained at low concentrations within the chamber 208.

The temperature within chamber 208 is maintained to between about 250° C. and about 350° C., and should be no more than around 400° C. to avoid diffusion of contact metal into the semiconductor layers of the multilayer waveguide structure.

The electronic control system associated with multi-chamber UHV system 600 can precisely control the amount of source material deposited on the sample by selectively adjusting the opening and closing of a shutter in front of each source (whether single element sources or compound element sources) to modify the deposition rate. When multiple single element sources are used, the electronic control system also allows precise control of the passivation layer stoichiometry, since the deposition rates for each different source material can be separately adjusted.

The growth conditions (e.g., film thickness, deposition rate, or uniformity, among conditions) can be monitored in situ based on observation of RHEED patterns. By monitoring the passivation layer growth with RHEED, the layer thickness, flatness and stoichiometry can be very precisely controlled, allowing extremely high quality passivation layers to be obtained, which substantially reduce the occurrence of COMD and which substantially increase the laser device lifetime. As with the atomic hydrogen cleaning chamber 206, the chamber 208 can include an electron source gun 504 and an electron detector (e.g., photoluminescent detector) 506, in which the source 504 is arranged to direct electrons toward the sample surface and the detector 506 detects electrons that have been diffracted by the sample. The RHEED patterns produced at the detector can be monitored, e.g., using a charge-coupled device (CCD) camera and inspected to evaluate the growth conditions. A user of the system 600 may manually adjust the deposition process (e.g., alter the deposition rate of one or more source elements) based on the observation of the observed RHEED patterns. Alternatively, the electronic control system associated with the multi-chamber UHV system 600 can use image processing techniques to identify the RHEED patterns and automatically adjust the deposition process until a desired RHEED pattern and film thickness is obtained.

The laser device 10 is arranged and oriented on the support substrate within the chamber 208 such that the passivation layer 502 is formed on only one exposed and cleaned facet (e.g., facet 20) of the laser device 10. In the case that multiple laser devices 10 are loaded, the multiple laser devices are oriented and arranged such that each laser device has a single cleaved facet on which the single crystalline passivation layer is formed.

It is preferable, in some implementations, to form the passivation layer on both opposing facets of the laser device 10 (e.g., facets 20 and 22) to prevent contaminants and an amorphous oxide layer from forming on the facets. To form the passivation layer on the opposing facet, the orientation of the laser device 10 within the chamber 208 is modified so that the opposing facet can be exposed to the source material in the MBE process. In particular, the process 100 includes optionally re-arranging the laser device 10 from a first orientation to a second different orientation within the chamber 208 such that the second cleaved facet 22 of the laser device 10 is exposed to source material.

To re-arrange the orientation of the laser device 10, the transfer arm 201 extends from the central chamber of the system 200 into the MBE chamber 208 to obtain the sample holder containing the laser device (or multiple laser devices). The laser device 10 then is moved, using the transfer arm 201, from the MBE chamber 208 to the flip chamber 204. For example, the transfer arm 201 holding the laser device 10 can retract into the central chamber, where the arm 201 then rotates so that the arm 201 is aligned with a gate valve sealing the flip chamber 204. The gate valve of the flip chamber can then be opened to allow the transfer arm 201 to extend into the flip chamber 204. Subsequently, the transfer arm 201 can place the laser device 10 onto a support substrate within the flip chamber 204, where the device 10 is secured. As explained above, the orientation of the sample holder containing the laser device then is modified (e.g., flipped upside down) using the positioning device coupled to the holder.

After modifying the orientation of the laser device (or multiple laser devices) within the flip chamber 204, the transfer arm 201 extends into the flip chamber 204 to pick up the sample holder containing the laser device 10 having the modified orientation and then transfers the sample back to the MBE chamber 208 where the transfer arm 201 places the laser device 10 (or multiple laser devices) once again on the support substrate within the chamber 208 but with the modified orientation (e.g., flipped upside down). Since the MBE chamber 208, the central chamber and the flip chamber 204 are under UHV, the entire process of transferring, flipping, and transferring the laser device is performed under UHV.

Subsequent to forming the single crystalline passivation layer or layers, the process (100) can include forming (110) a dielectric coating/layer on the passivation layer. The purpose of forming the dielectric coating is to provide both optical feedback to the multilayer waveguide structure and protection of the passivation layer. Furthermore, for dielectric coatings having sufficiently high density, the amount of optical absorption of light from the waveguide structure can be reduced, leading to improved laser device efficiency.

To form the dielectric layer, the sample holder containing the laser device 10 (or multiple laser devices) is transferred, by the transfer arm 201, from the MBE chamber 208 to the dielectric coating chamber 210. The transfer arm 201 places the laser device 10 on a support substrate within the chamber 210, where the device (or multiple laser devices) is secured. The pressure within the coating chamber 210 and within the central chamber during transfer of the laser device 10 is maintained under UHV.

Figure 6:
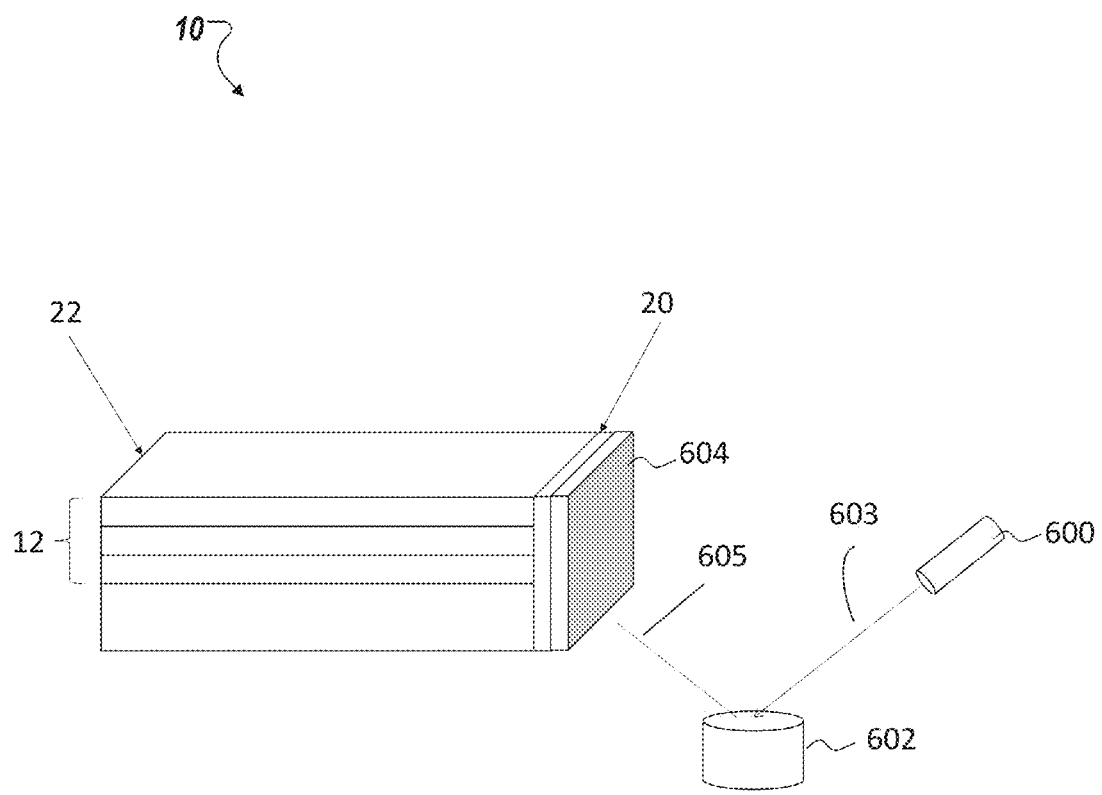

FIG. 6 illustrates an example of a laser device 10 contained within the coating chamber 210. The coating chamber 210 can include an ion-beam sputtering source 600 and one or more targets 602 for performing IBSD. Ion beams 603 generated by the source 600 are directed towards the target 602, such that the material from target 602 is sputtered (605)

onto the sample as a dielectric layer 604. The electronic control system 240 associated with multi-chamber UHV system 600 can precisely control the amount of target material deposited on the sample, and thus the thickness of the dielectric coating, by adjusting the intensity of the ion beam generated by the source 600.

The laser device 10 is arranged and oriented on the support substrate within the chamber 210 such that the dielectric material is deposited on one facet of the laser device 10. In the case that multiple laser devices 10 are loaded, the devices 10 are oriented and arranged such that each laser device has a single cleaved facet on which the dielectric layer 604 is formed.

In some implementations, the presence of the sputtered material can cause the pressure within the chamber 210 to rise. For instance, the pressure within the chamber 210 can increase to as much as $10^{-5}$ Torr. Despite the rise in pressure, the environment can still be understood as being ultra-high vacuum, since the presence of undesired gas or contaminants can be maintained at low concentrations within the chamber 210.

In some implementations, a facet of the multilayer waveguide structure is covered with a dielectric coating forming a high-reflectivity (HR) film designed to reflect light having a desired wavelength, whereas a second opposite facet of the multilayer waveguide structure is covered with a slightly less reflective (an AR film) film that allows amplified light having the desired wavelength to escape the structure as laser light. Alternatively, in some implementations, both facets of the waveguide structure have AR films and an external feedback is provided to establish a reflective optical cavity. For example, the external feedback can include one or more mirrors or volume bragg gratings. Either the HR film or the AR film can include a single layer or multiple layers of dielectric material. For example, the AR film can include a single layer having a thickness equal to about a quarter of the emitted wavelength and including one or a combination of dielectric materials, such as $SiO_2$, $Si_3N_4$, $Nb_2O_5$, $Al_2O_3$, $Ta_2O_5$, or $TiO_2$, among other materials. Alternatively, the AR film can include a Bragg mirror formed of multiple layers of dielectric material and designed for the particular wavelength emitted from the waveguide structure. Similar approaches can be used to form the HR film.

In implementations where the dielectric coatings are formed on both facets, the orientation of the laser device 10 within the chamber 210 is modified so that both the first and second opposing facets are coated with the dielectric material. In particular, the process 100 includes optionally re-arranging the laser device 10 from a first orientation to a second different orientation within the chamber 210 such that the second cleaved facet of the laser device 10 can be exposed to sputtered dielectric material.

To re-arrange the orientation of the laser device 10, the transfer arm 201 extends from the central chamber of the system 200 into the dielectric coating chamber 210 to obtain the sample holder containing the laser device (or multiple laser devices). The laser device 10 then is moved, using the transfer arm 201, from the dielectric coating chamber 210 to the flip chamber 204. For example, the transfer arm 201 holding the laser device 10 can retract into the central chamber, where the arm 201 then rotates so that the arm 201 is aligned with a gate valve sealing the flip chamber 204. The gate valve of the flip chamber can then be opened to allow the transfer arm 201 to extend into the flip chamber 204. Subsequently, the transfer arm 201 can place the laser device 10 onto a support substrate within the flip chamber 204, where the device 10 is secured. As explained above, the orientation of the sample holder, and thus the laser device held by the sample holder, then is modified (e.g., flipped upside down) using the positioning device coupled to the holder.

After modifying the orientation of the laser device (or multiple laser devices) within the flip chamber 204, the transfer arm 201 extends into the flip chamber 204 to pick up the laser device 10 having the modified orientation and then transfers the sample back to the dielectric coating chamber 210 where the transfer arm 201 places the laser device 10 (or multiple laser devices) once again on the sample holder within the chamber 210 but with the modified orientation (e.g., flipped upside down). Since the dielectric coating chamber 210, the central chamber and the flip chamber 204 are under UHV, the entire process of transferring, flipping, and transferring the laser device is performed under UHV.

Figure 7:
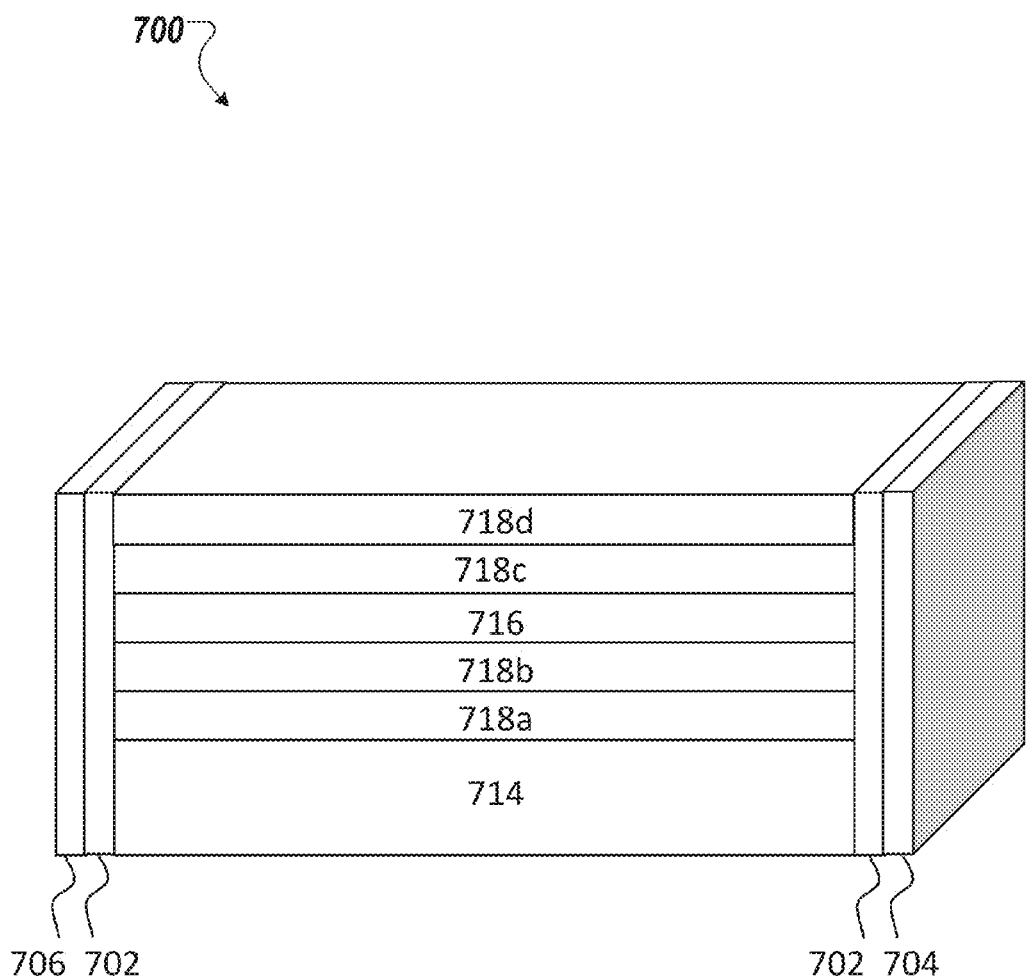
FIG. 7 is a schematic diagram that illustrates an example of a laser device fabricated according to the process of FIG. 1.

FIG. 7 illustrates an example of a laser device 700 formed using the process 100 disclosed herein. The laser device 700 includes a multilayer waveguide structure formed on a substrate 714. The substrate 714 includes, for example, GaAs doped N-type (e.g., using Si as the dopant material). The multilayer structure includes an optically active layer 716 formed of InGaAs, surrounded by multiple cladding layers 718. Cladding layers 718 include, for example, at least a first $Al_xGa_{1-x}As$ cladding layer 718a on the GaAs substrate, at least a first $Al_yGa_{1-y}As$ cladding layer 718b on the first $Al_xGa_{1-x}As$ cladding layer 718a, a second $Al_yGa_{1-y}As$ cladding layer 718c on the InGaAs active layer, and a second $Al_xGa_{1-x}As$ cladding layer 718d on the second $Al_yGa_{1-y}As$ cladding layer, in which the second $Al_xGa_{1-x}As$ cladding layer 718d is doped P-type (e.g., using C as the dopant material). The values for x are between 0.15 to 0.6, and the values for y are between 0.15 to 0.35. The device 700 further includes a ZnSe single crystalline passivation layer 702 formed on each of a first and second opposing facet of the multilayer waveguide structure 712, a $Al_2O_3$ AR coating 704 on the first facet, and a $Al_2O_3$ HR coating 706 on the second facet.

Experimental Results

Figure 8:
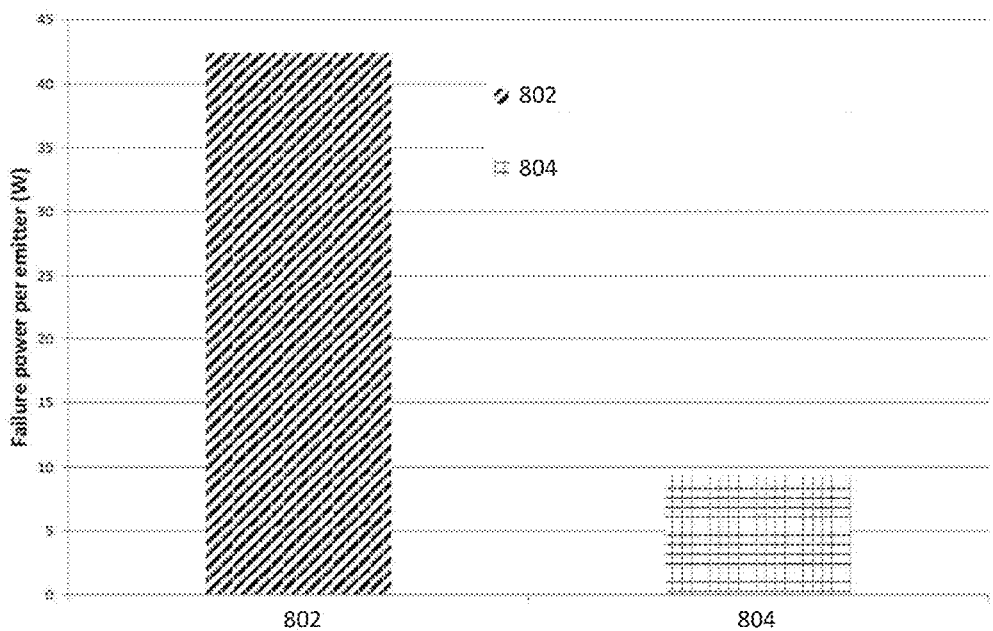
FIG. 8 is a plot illustrating failure power of two separate laser arrays versus different fabrication processes.

FIG. 8 is a plot illustrating failure power of two separate laser arrays versus different fabrication processes. The lasers of the first array were prepared using the processes described herein so that they included a single crystalline passivation layer formed entirely under UHV conditions. The second lasers of the second array were prepared with an amorphous passivation layer not, in which UHV conditions were not maintained during processing. Each laser array included 8 laser diodes, in which the width of the array was 10 mm and the cavity length was 4 mm. The arrays were mounted on copper blocks during the tests. The tests were carried out with pulse lasers (100 μs pulse duration, 0.1% duty cycle).

As shown in the plot of FIG. 8, the laser diodes formed using the novel process disclosed herein (802) failed at a maximum power of about 43 W per emitter, which was approximately 4 times higher than the failure power (about 10 W per emitter) of devices formed without using the presently disclosed processes (804). Furthermore, a visual inspection of the failed emitters formed using the novel processes disclosed herein excluded COMD as the root cause of device failure, whereas for the devices failing at about 10 W per emitter, COMD was identified as the root cause of failure.

Figure 9:
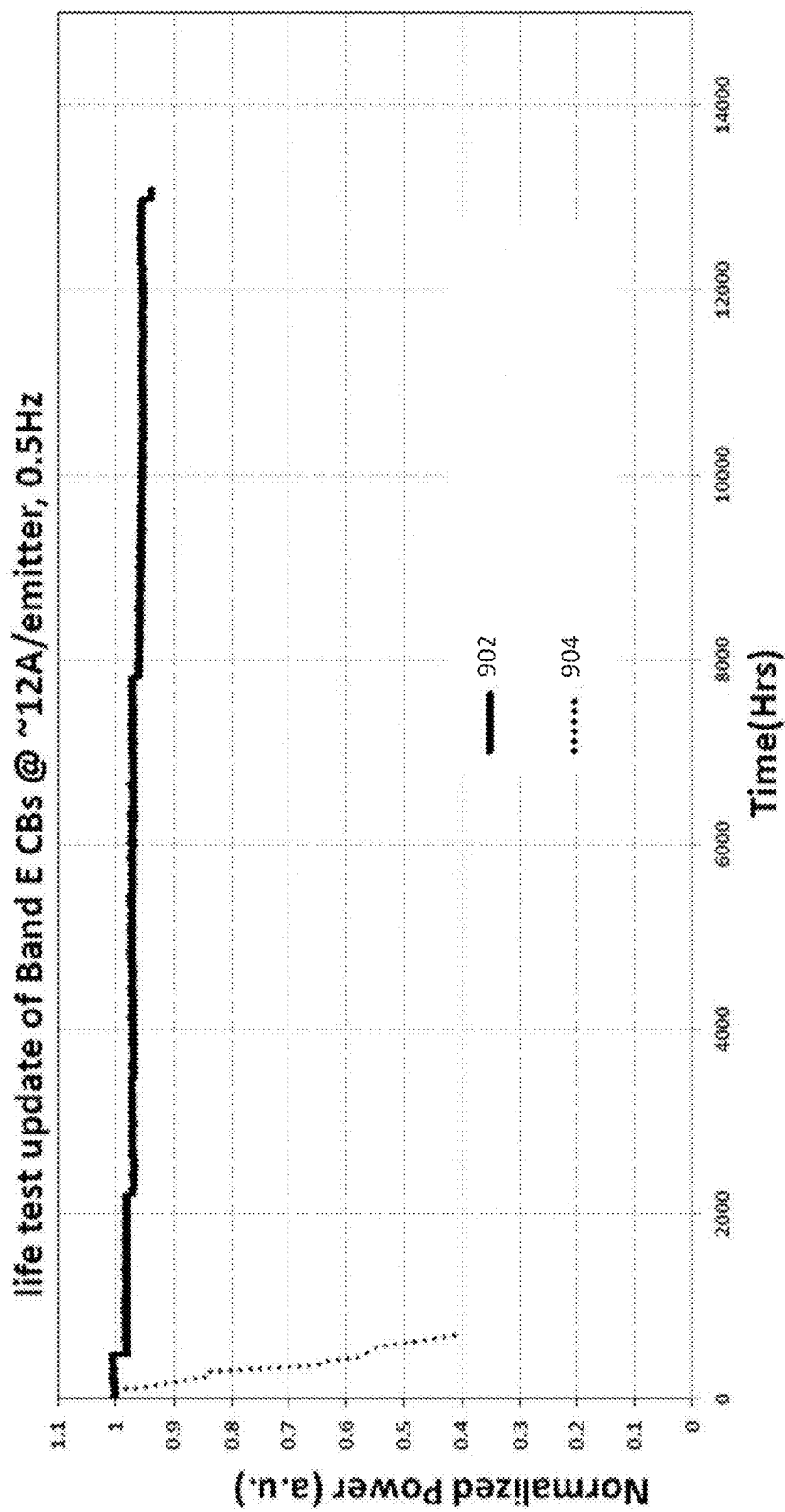
FIG. 9 is a plot of lifetime tests for laser diode arrays formed using different fabrication processes.

FIG. 9 is a plot of lifetime tests for an array of laser diode devices formed according to the novel processes described herein (902) and an array of laser diode devices that were fabricated without the single crystalline passivation layer (904) as taught herein. In particular, the plot illustrates normalized output power versus time. Each laser array included 8 laser diodes, in which the width of the array was 10 mm and the cavity length was 4 mm. The devices were tested by applying a pulsed current of 95 A per array (12 A per emitter) for 1 second on duration and 1 second off duration (0.5 Hz, 50% duty cycle). As shown in FIG. 9, there was no substantial degradation observed after 7000 hours or more of operation for the laser diode array formed using the novel processes described herein (902). In contrast, for the laser diode array formed without the single crystalline passivation layer (904) as taught herein, the device failed in under 1000 hours.

Figure 10:
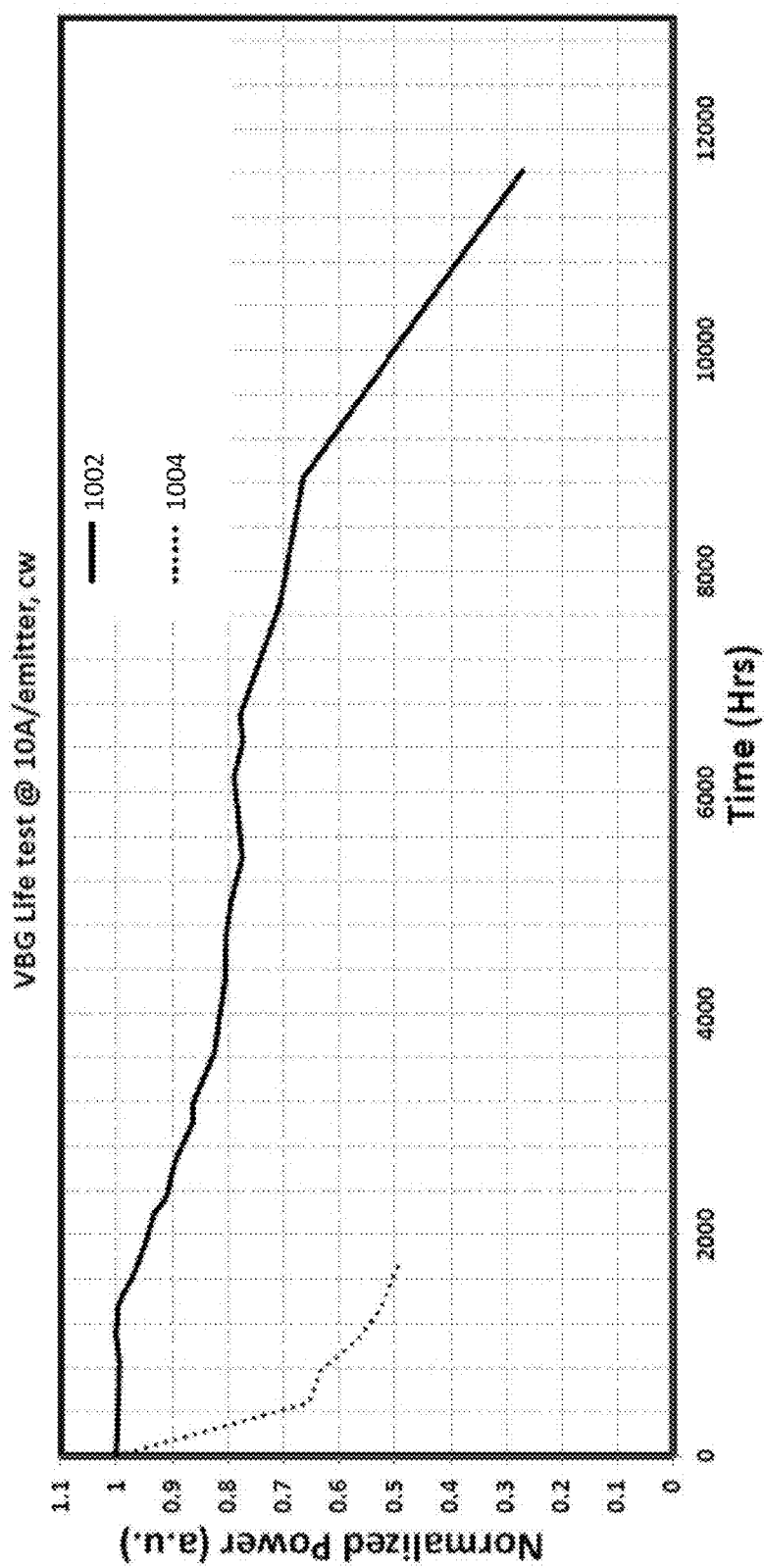
FIG. 10 is a plot of lifetime tests for laser diode arrays formed using different fabrication processes.

FIG. 10 is a plot of lifetime tests for an array of laser diode devices formed according to the novel process described herein (1002) and an array of laser diode devices that were fabricated without the single crystalline passivation layer (1004) as taught herein. In particular, the plot illustrates normalized output power versus time. Each laser array included 8 laser diodes, in which the width of the array was 10 mm and the cavity length was 4 mm. In contrast to the devices tested in FIGS. 7-8, the devices tested for the plot shown in FIG. 9 included external Volume Bragg Grating feedbacks, as opposed to dielectric reflective coatings on the passivation layers. The devices were tested by applying continuous wave (CW) power at 80 A per array for devices formed according to the novel process described herein and 60 A per array for devices formed without the single crystalline passivation layer as taught herein. As illustrated in FIG. 10, the normalized power of devices formed with the single crystalline passivation layer using the novel processes disclosed herein (1002) was substantially higher for a much longer period of time relative to the device without the single crystalline passivation layer (1004). While the external Volume Bragg Grating feedbacks improve emission laser beam quality, they also may lead to shorter lifetimes, as illustrated by the difference in lifetimes for the devices operating at 80 A in FIG. 10 versus the devices operating at 95 A in FIG. 9.

As the foregoing examples illustrate, the novel laser diode fabrication processes described herein lead to laser devices having superior performance, reliability and lifetimes. Furthermore, the foregoing examples demonstrate that the novel processes disclosed herein can even eliminate COMD as the root cause of laser device failure.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method of passivating a multilayer waveguide structure, the method comprising:
   cleaning, in a first chamber of a multi-chamber ultra-high vacuum (UHV) system, a first facet of the multilayer waveguide structure, wherein the multilayer waveguide structure is arranged according to a first orientation within the first chamber during the cleaning of the first facet;
   transferring the cleaned multilayer waveguide structure from the first chamber to a second chamber of the multi-chamber UHV system;
   forming, in the second chamber, a first single crystalline passivation layer on the first facet;
   transferring the multilayer waveguide structure from the second chamber to a third chamber of the multi-chamber UHV system;
   forming, in the third chamber, a first dielectric coating on the first single crystalline passivation layer;
   arranging the multilayer structure according to a second orientation within the first chamber different from the first orientation; and
   cleaning a second facet of the multilayer waveguide structure while the multilayer structure is arranged according to the second orientation within the first chamber,
   wherein the method is performed in an UHV environment of the multi-chamber UHV system without removing the multilayer waveguide structure from the UHV environment.

2. The method of claim 1, further comprising monitoring a quality of the first single crystalline passivation layer during formation of the first single crystalline passivation layer.

3. The method of claim 2, wherein monitoring the quality of the first single crystalline passivation layer comprises obtaining a reflection high energy electron diffraction (RHEED) pattern from the first single crystalline passivation layer.

4. The method of claim 1, wherein arranging the multilayer structure according to the second orientation within the first chamber comprises:
   transferring the multilayer waveguide structure, after cleaning the first facet, from the first chamber to a fourth chamber of the multi-chamber UHV system;
   turning the multilayer waveguide structure in the fourth chamber; and
   transferring the turned multilayer waveguide structure from the fourth chamber to the first chamber.

5. The method of claim 1, wherein the multilayer waveguide structure is arranged according to a first orientation within the second chamber during the forming of the first passivation layer on the first facet, and wherein the method further comprises:
   arranging the multilayer waveguide structure according to a second orientation within the second chamber different from the first orientation in the second chamber; and
   forming a second single crystalline passivation layer on the second facet while the multilayer structure is arranged within the second chamber according to the second orientation.

6. The method of claim 5, wherein arranging the multilayer structure within the second chamber according to the second orientation comprises:
   transferring the multilayer waveguide structure, after forming the first passivation layer, from the second chamber to a fourth chamber of the multi-chamber UHV system;
   turning the multilayer waveguide structure in the fourth chamber; and
   transferring the turned multilayer waveguide structure from the fourth chamber to the second chamber.

7. The method of claim 1, wherein cleaning the first facet comprises chemically removing an oxide from the first facet of the multilayer waveguide structure by exposing the first facet to atomic hydrogen.

8. The method of claim 1, wherein the method further comprises exposing the multilayer waveguide structure to infrared radiation so as to heat the multilayer waveguide structure at a temperature between about 150° C. and about 200° C.

9. The method of claim 1, wherein the first passivation layer is lattice-matched to the first facet of the multilayer waveguide structure.

10. The method of claim 1, wherein the first passivation layer is applied until the layer has a thickness between about 10 nm to about 60 nm.

11. The method of claim 1, wherein the first passivation layer comprises a Group II-VI semiconductor compound material.

12. The method of claim 1, further comprising passivating at least one facet of each of a plurality of multilayer waveguide structures in the UHV environment of the multi-chamber UHV system without removing the plurality of multilayer waveguide structures from the UHV environment, wherein the plurality of multilayer waveguide structures are stacked onto a fixture.

13. A multi-chamber ultra-high vacuum (UHV) system comprising:
a central chamber comprising a transfer arm;
a plurality of secondary chambers, each of which is coupled to the central chamber by a corresponding gate valve,
wherein the plurality of secondary chambers comprises an outgassing chamber, an atomic hydrogen cleaning chamber, a molecular beam epitaxy chamber, an ion-beam sputter deposition chamber, and a device flipping chamber, and
wherein the transfer arm is configured to extend from the central chamber into each secondary chamber of the plurality of secondary chambers;
a pump system operable to establish a UHV environment in each of the central chamber and the plurality of secondary chambers; and
a control system operatively coupled to the transfer arm, the gate valves and to the pump system, and configured to automatically control movement of the transfer arm and opening and closing of the gate valves.

14. The system of claim 13, wherein the outgassing chamber comprises an infrared light source.

15. The system of claim 13, further comprising a radio-frequency (RF)-generator and an atomic hydrogen source coupled to the atomic hydrogen cleaning chamber and to the control system,
wherein the control system is further configured to activate a plasma within the atomic hydrogen cleaning chamber by automatically controlling a power generated by the RF-generator and by automatically controlling a flow of atomic hydrogen into the cleaning chamber from the atomic hydrogen source.

16. The system of claim 13, wherein the molecular beam epitaxy chamber comprises:
an electron source gun operable to produce a beam of electrons, wherein the electron source gun is arranged to direct the beam of electrons toward a sample location within the molecular beam epitaxy chamber; and
a detector arranged to detect electrons produced by the electron source gun and diffracted from the sample location to create a reflection high-energy electron diffraction (RHEED) pattern.

* * * * *

UNITED STATES PATENT AND TRADEMARK OFFICE
CERTIFICATE OF CORRECTION

PATENT NO. : 9,972,968 B2
APPLICATION NO. : 15/133334
DATED : May 15, 2018
INVENTOR(S) : Qiang Zhang et al.

It is certified that error appears in the above-identified patent and that said Letters Patent is hereby corrected as shown below:

On the Title Page

Item (*) Notice Line 3, after "0 days." delete "days."

Signed and Sealed this
Sixth Day of August, 2019

Andrei Iancu
*Director of the United States Patent and Trademark Office*